US007830129B2

(12) United States Patent
Tseng

(10) Patent No.: US 7,830,129 B2
(45) Date of Patent: Nov. 9, 2010

(54) CONTROL CIRCUIT, VOLTAGE REGULATOR AND RELATED CONTROL METHOD

(75) Inventor: Yang-Tai Tseng, Hsin-Chu (TW)

(73) Assignee: Leadtrend Technology Corp., Science-Based Industrial Park, Hsin-Chu (TW)

( * ) Notice: Subject to any disclaimer, the term of this patent is extended or adjusted under 35 U.S.C. 154(b) by 64 days.

(21) Appl. No.: 12/269,893

(22) Filed: Nov. 13, 2008

(65) Prior Publication Data

US 2010/0117608 A1 May 13, 2010

(51) Int. Cl.
*G05F 1/00* (2006.01)
*H03H 1/00* (2006.01)

(52) U.S. Cl. ....................................... 323/281; 323/369

(58) Field of Classification Search ................ 323/281, 323/369, 364
See application file for complete search history.

(56) References Cited

U.S. PATENT DOCUMENTS 6,011,385 A * 1/2000 Brandt et al. ............... 323/280

* cited by examiner

*Primary Examiner*—Shawn Riley
(74) *Attorney, Agent, or Firm*—Winston Hsu; Scott Margo

(57) ABSTRACT

A control circuit, applicable to a voltage regulator including a power switch. The control circuit includes a variable resistance generating unit and a detecting circuit. The variable resistance generating unit provides a variable resistor with resistance that varies over time. A reference current representing the current flowing through the power switch flows through the resistor to generate a first feedback voltage. The detecting circuit reduces the conduction of the power switch when the first feedback voltage is detected as being equal to or exceeding a predetermined voltage level.

22 Claims, 3 Drawing Sheets

CONTROL CIRCUIT, VOLTAGE REGULATOR AND RELATED CONTROL METHOD

BACKGROUND OF THE INVENTION

1. Field of the Invention

The present invention relates to a voltage regulator, and more particularly, to a low drop-out voltage regulator for eliminating or reducing an inrush current, and a related control method.

2. Description of the Prior Art

Conventionally, a low drop-out regulator can be utilized as a DC-to-DC voltage regulator. If the low drop-out regulator enters a normal state immediately after power on without entering a soft start phase first, a large inrush current may be generated. The inrush current may cause a voltage drop at the node connected to a power source that supplies power to the low drop-out regulator but has a slow response speed. As a result, this voltage drop may affect other functional circuits that connect to the node. Therefore, the low drop-out regulator should enter the so-called soft start phase after the low drop-out regulator is powered on to reduce or eliminate the detrimental inrush current.

SUMMARY OF THE INVENTION

According to an embodiment of the present invention, a control circuit is provided. The control circuit is applicable to a voltage regulator comprising a power switch. The control circuit comprises a variable resistance generating unit and a detecting circuit. The variable resistance generating unit provides a variable resistor having a time varying resistance, wherein a reference current flows through the variable resistor to generate a first feedback voltage, and the reference current represents a current that flows through the power switch. The detecting circuit reduces the conduction of the power switch when it detects that the first feedback voltage is equal to or exceeds a predetermined value.

According to an embodiment of the present invention, a voltage regulator is provided, comprises the control circuit mentioned in the last paragraph and an amplifier. The amplifier generates a control signal that controls the power switch according to a second feedback voltage and a reference value, wherein the second feedback voltage represents an output voltage of the voltage regulator.

An embodiment of the present invention provides a control method applicable to a voltage regulator comprising a power switch. A variable resistor is provided, a reference current is generated to represent a current flowing through the power switch, the reference current is enabled to flow through the variable resistor, a first feedback voltage on the variable resistor is detected, a conduction of the power switch is reduced when it is detected that the first feedback voltage is equal to or exceeds a predetermined value, and a resistance of the variable resistor is changed over time.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
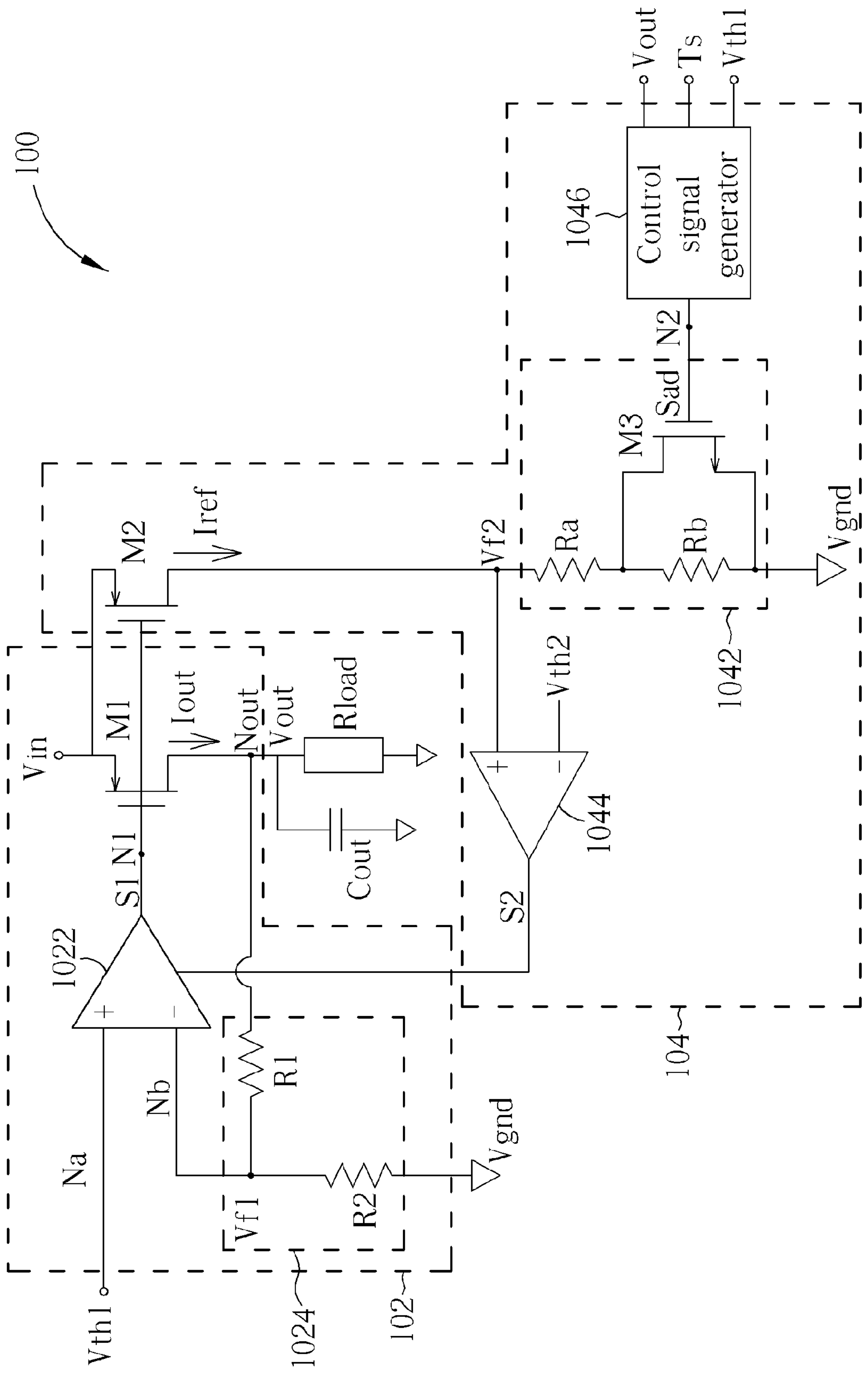
FIG. 1 is a diagram illustrating a voltage regulator according to an embodiment of the present invention.

Please refer to FIG. 1. FIG. 1 is a diagram illustrating a voltage regulator 100 according to an embodiment of the present invention. Voltage regulator 100 comprises a voltage regulating voltage 102 and a control circuit 104. Voltage regulating voltage 102 converts an input voltage Vin into an output voltage Vout. Control circuit 104 is arranged to prevent the occurrence of an inrush current.

Voltage regulating voltage 102 comprises an error amplifier 1022, a power switching PMOS transistor M1 and a resistive voltage divider 1024. An output capacitor Cout is coupled to an output terminal Nout, functioning to stabilize the output voltage Vout of the voltage regulator 100, as well-known by those skilled in this art. The connection between the internal circuit elements of the voltage regulating voltage 102 is as shown in FIG. 1, and is well-known by those skilled in this art, thus a detailed description is omitted here for brevity. In brief, the negative feedback voltage Vf1 provides a negative feedback mechanism for the voltage regulating circuit 102 to stabilize the output voltage Vout at about Vout_traget (i.e., the reference voltage Vth1$*(R_1+R_2)/R_2$), wherein $R_x$ is the resistance of the resistor Rx.

Control circuit 104 comprises a PMOS transistor M2, a detecting circuit 1044, a control signal generator 1046, and a resistor generator 1042. Control signal generator 1046 and resistor generator 1042 are configured as a variable resistor generating unit. PMOS transistor M2 and power switching PMOS transistor MI are configured as a current mirror. PMOS transistor M2 generates reference current Iref substantially proportional to output current lout that flows through power switching PMOS transistor M1. Control signal generator 1046 generates a control signal Sad to determine a resistance $R_{effect}$ of the resistor generator 1042 according to output voltage Vout, a soft start time Ts, and a reference voltage Vth1. Resistor generator 1042 comprises resistor Ra connected in series to resistor Rb, and an NMOS transistor M3 connected in parallel to resistor Rb, wherein a gate terminal N2 of NMOS transistor M3 couples to receive control signal Sad. Detecting circuit 1044, e.g. a comparator in the FIG. 1, detects feedback voltage Vf2 induced by reference current Iref. When feedback voltage Vf2 is detected as being equal to or exceeding reference voltage Vth2, detecting circuit 1044 varies the conduction of the power switching PMOS transistor M1, e.g. reduces the conduction of the power switching PMOS transistor M1 or completely turns off the power switching PMOS transistor M1. In brief, the control circuit 104 limits the output current Iout to be smaller than the maximum allowable current $I_{limit}$ (i.e., K*Vth2/$R_{effect}$) through the feedback controlling mechanism, where the resistance $R_{effect}$ is the effective resistance of resistor generator 1042 changing over time, and K is the ratio of $I_{out}$ over $I_{ref}$. The resistance $R_{effect}$ may be set to a relatively large value during the soft start period to obtain a relatively low maximum allowable current $I_{limit}$ in order to prevent the inrush current. Once the soft start period is over, the resistance $R_{effect}$ may be set to a relatively small value to obtain a relatively large maximum allowable current $I_{limit}$ in order to define the maximum limit current of the loading under the normal state. Compared to the voltage regulating circuit 102, the control circuit 104 may be designed to possess a relatively wider open-loop bandwidth, i.e., control circuit 104 responds faster than the voltage regulating circuit 102, in view of the variation to the output current Iout. Through the speedy response upon the output current Iout, control circuit 104 prevents the excess current of the output current Iout.

Figure 2:
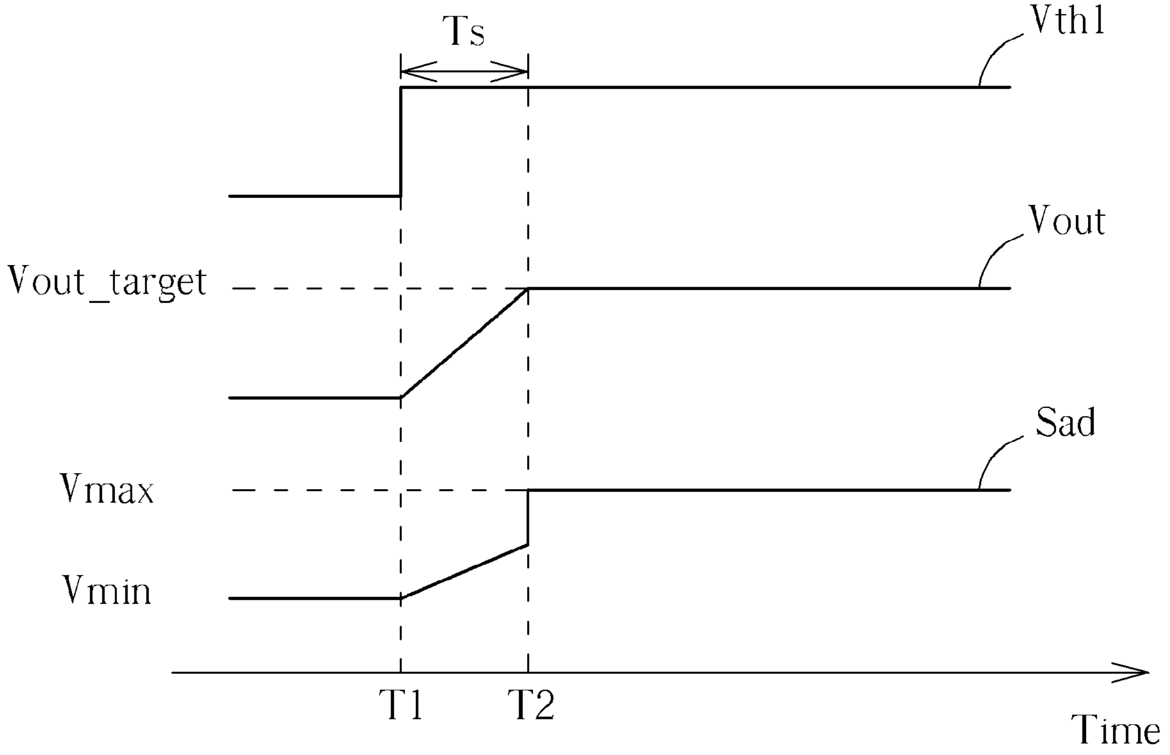
FIG. 2 is a timing diagram illustrating a reference voltage, an output voltage, and a control signal of the voltage regulator as shown in FIG. 1.

FIG. 2 is a timing diagram exemplifying the reference voltage Vth1, the output voltage Vout, and the control signal Sad of voltage regulator 100 as shown in FIG. 1. When voltage regulator 100 is turned on at time T1, reference voltage Vth1 is directly set to a predetermined value. Then, the voltage regulator 100 enters a soft start state, the period Ts between the time T1 and T2. Since output voltage Vout has not reached a predetermined value Vout_target during the soft start time Ts yet, voltage regulating circuit 102 tends to turn on the power switching PMOS transistor M1 and charge the output capacitor Cout, increasing the output voltage Vout. Meanwhile, the maximum allowable current $I_{limit}$ of power switching PMOS transistor M1 is under the control of control circuit 104. In FIG. 1, it can be determined that the resistance $R_{effect}$ of the resistor generator 1042 is a decreasing function of the voltage level of control signal Sad, while the resistance $R_{effect}$ is also inversely proportional to the maximum allowable current $I_{limit}$ of the output current Iout, as stated in the above description. In other words, the higher the voltage level of the control signal Sad, the smaller the resistance $R_{effect}$, and the larger the maximum allowable current $I_{limit}$. Therefore, the control signal Sad as shown in FIG. 2 means that a relatively low value of the maximum allowable current $I_{limit}$ is set in the beginning of the soft start time Ts, such that inrush current can be avoided while maintaining the charging of the output capacitor Cout. Furthermore, during the soft start time Ts, the maximum allowable current $I_{limit}$ increases gradually to increase the maximum allowable current. Beyond the soft start time Ts, the maximum allowable current $I_{limit}$ can be set to a fixed value in order to define the maximum limit current of the loading under the normal state.

Please note that the control signal generator 1046 of the present invention is not limited to the method of gradually increasing the control signal Sad to gradually decrease the variable resistance $R_{effect}$: Any methods of monotonically varying the control signal Sad belong to the scope of the present invention. For example, control signal generator 1046 may increase the voltage level of control signal Sad step by step to decrease the resistance $R_{effect}$ step by step. Control signal generator 1046 may also vary the control signal Sad according to output voltage Vout. Those skilled in this art will readily understand that the resistance $R_{effect}$ can also be varied by adjusting the control signal Sad to control a PMOS transistor (rather than a NMOS transistor as shown in FIG. 1 ) after reading the disclosure of the present invention.

The time T2, i.e., the moment when the soft start time Ts is over, can be determined through various means. For example, the soft start time Ts can be determined as being over when the output voltage Vout is detected to be equal to the predetermined value Vout_target, and then control signal generator 1046 sets the maximum allowable current $I_{limit}$ to be the maximum value. In another example, a timer can be installed in control signal generator 1046 to determine the soft start time Ts is over when a predetermined time elapses after the time T1. According to the embodiment of the present invention, control signal generator 1046 may individually decide the ending time of the soft start time Ts, or the ending time of the soft start time Ts is decided by other devices to signal the ending time to the control signal generator 1046.

Figure 3:
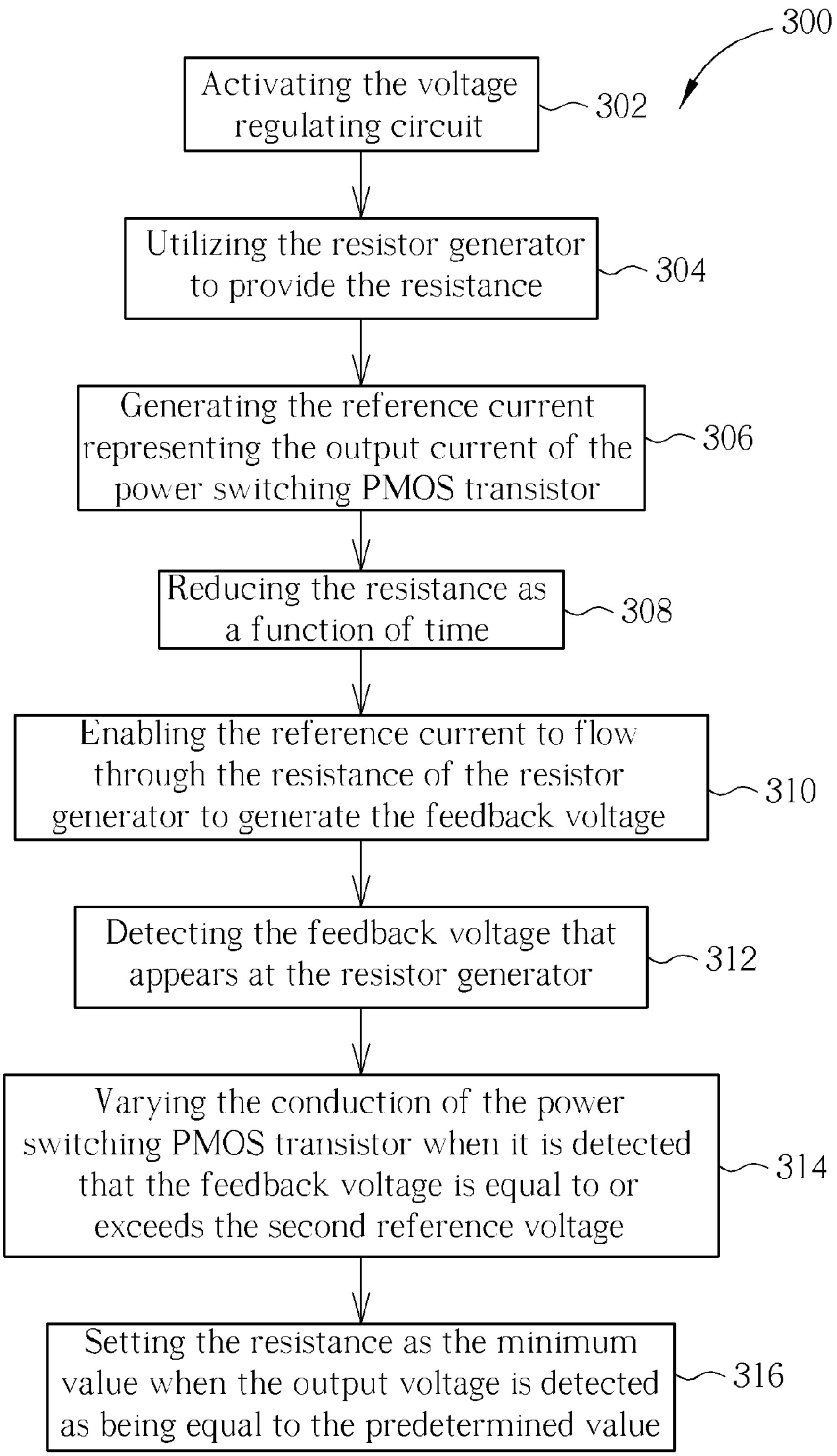
FIG. 3 is a flowchart illustrating a control method according to an embodiment of the present invention.

Please refer to FIG. 3. FIG. 3 is a flowchart illustrating a control method 300 according to an embodiment of the present invention. The control method 300 is for preventing an inrush current of a voltage regulating circuit. The control method 300 is described in accordance with the voltage regulator 100 as shown in FIG. 1 for brevity. Provided that substantially the same result is achieved, the steps of the flowchart shown in FIG. 3 need not be in the exact order shown and need not be contiguous, that is, other steps can be intermediate. The control method 300 comprises:

step 302: activating the voltage regulating circuit 102;

step 304: utilizing the resistor generator 1042 to provide the resistance $R_{effect}$, which has a predetermined value of maximum value Rmax;

step 306: generating the reference current Iref representing the output current Iout of the power switching PMOS transistor M1;

step 308; reducing the resistance $R_{effect}$ as a function of time;

step 310: enabling the reference current Iref to flow through the resistance $R_{effect}$ of the resistor generator 1042 to generate the feedback voltage Vf2;

step 312: detecting the feedback voltage Vf2 that appears at the resistor generator 1042;

step 314: varying the conduction of power switching PMOS transistor M1 when it is detected that the feedback voltage Vf2 is equal to or exceeds the second reference voltage Vth2; and step 316: setting the resistance $R_{effect}$ as the minimum value Rmin when the output voltage Vout is detected as being equal to the predetermined Vout_target.

When voltage regulating circuit 102 is first activated in step 302, the voltage regulating circuit 102 enters the soft start state. In order to prevent the inrush current at the instance of power on, the control method 300 of the present invention varies the resistance $R_{effect}$ of the resistor generator 1042 to control the maximum allowable value $I_{limit}$ of the output current. More specifically, the control method 300 monotonically reduces the resistance $R_{effect}$ after the power is on, and the maximum allowable value $I_{limit}$ increases accordingly. In step 316, the resistance $R_{effect}$ is set to the minimum value Rmin, allowing output current Iout to be as large as the maximum allowable value $I_{limit}$ when the output voltage Vout is equal to the predetermined value Vout_target.

Those skilled in the art will readily observe that numerous modifications and alterations of the device and method may be made while retaining the teachings of the invention.

What is claimed is:

1. A control circuit, applicable to a voltage regulator comprising a power switch, the control circuit comprising:

a variable resistance generating unit, for providing a variable resistor having a time varying resistance, wherein a reference current flows through the variable resistor to generate a first feedback voltage, and the reference current represents a current that flows through the power switch; and a detecting circuit, for reducing a conduction of the power switch when it detects that the first feedback voltage is equal to or exceeds a predetermined value.

2. The control circuit of claim 1, wherein the variable resistance generating unit comprises:

a control signal generator, for generating a control signal; and a resistor generator, for determining a resistance of the variable resistor according to the control signal.

3. The control circuit of claim 2, wherein the control signal generator generates the control signal according to a second feedback voltage, and the second feedback voltage represents an output voltage of the voltage regulator.

4. The control circuit of claim 3, wherein the control signal generator varies the control signal in a soft start phase, and the soft start phase is in an interval between a starting time of the voltage regulator and a time when the second feedback voltage reaches a reference voltage.

5. The control circuit of claim 3, wherein the control signal generator varies the control signal monotonically in the soft start phase.

6. The control circuit of claim 2, wherein the resistor generator comprises a transistor, and the transistor determines the resistance of the variable resistor according to the control signal.

7. The control circuit of claim 6, wherein the resistor generator further comprises a resistor connected in series to the transistor.

8. The control circuit of claim 6, wherein the resistor generator further comprises a resistor connected in parallel to the transistor.

9. The control circuit of claim 1, wherein the detecting circuit comprises a first comparator for detecting if the first feedback voltage is equal to or exceeds the predetermined value.

10. The control circuit of claim 1, further comprising a transistor, wherein the transistor and the power switch are arranged as a current mirror, and the reference current flows through the transistor.

11. A voltage regulator, comprising:

a control circuit as claimed in claim 1; and an amplifier, for generating a control signal controlling the power switch according to a second feedback voltage and a reference value, wherein the second feedback voltage represents an output voltage of the voltage regulator.

12. The voltage regulator of claim 11, further comprising a voltage divider, wherein the voltage divider generates the second feedback voltage according to the output voltage.

13. A control method, applicable to a voltage regulator comprising a power switch, the control method comprising:

providing a variable resistor;

generating a reference current representing a current that flows through the power switch;

enabling the reference current to flow through the variable resistor;

detecting a first feedback voltage on the variable resistor;

reducing a conduction of the power switch when it is detected that the first feedback voltage is equal to or exceeds a predetermined value; and changing over time a resistance of the variable resistor.

14. The control method of claim 13, wherein the step of changing the resistance of the variable resistor according to time comprises:

generating a control signal; and determining the resistance of the variable resistor according to the control signal.

15. The control method of claim 14, wherein the step of generating the control signal comprises:

generating the control signal according to a second feedback voltage, wherein the second feedback voltage represents an output voltage of the voltage regulator.

16. The control method of claim 15, further comprising varying the control signal in a soft start phase, wherein the soft start phase is in an interval between a starting time of the voltage regulator and a time when the second feedback voltage reaches a reference voltage.

17. The control method of claim 16, further comprising varying the control signal monotonically in the soft start phase.

18. The control method of claim 13, wherein the step of providing the variable resistor comprises connecting a control signal to a transistor.

19. The control method of claim 18, wherein the step of providing the variable resistor further comprises connecting a resistor to the transistor in series.

20. The control method of claim 18, wherein the step of providing the variable resistor further comprises connecting a resistor to the transistor in parallel.

21. The control method of claim 13, wherein the step of detecting the first feedback voltage of the variable resistor comprises utilizing a first comparator to detect if the first feedback voltage is equal to or exceeds the predetermined value.

22. The control method of claim 13, further comprising utilizing a transistor and the power switch to form a current mirror to generate the reference current.

* * * * *